(12) United States Patent
Kulkarni et al.

(10) Patent No.: US 7,672,152 B1
(45) Date of Patent: Mar. 2, 2010

(54) MEMORY CELL WITH BUILT-IN PROCESS VARIATION TOLERANCE

(75) Inventors: Jaydeep P. Kulkarni, West Lafayette, IN (US); Kaushik Roy, West Lafayette, IN (US)

(73) Assignee: Purdue Research Foundation, West Lafayette, IN (US)

(*) Notice: Subject to any disclaimer, the term of this patent is extended or adjusted under 35 U.S.C. 154(b) by 94 days.

(21) Appl. No.: 12/038,314

(22) Filed: Feb. 27, 2008

Related U.S. Application Data

(60) Provisional application No. 60/891,830, filed on Feb. 27, 2007.

(51) Int. Cl.
*G11C 11/00* (2006.01)

(52) U.S. Cl. ...................... 365/154; 365/190
(58) Field of Classification Search ................ 365/156
See application file for complete search history.

(56) References Cited

U.S. PATENT DOCUMENTS

| | | | | |
|---|---|---|---|---|
| 4,620,297 | A * | 10/1986 | Houston | 365/174 |
| 6,744,661 | B1 * | 6/2004 | Shubat | 365/156 |
| 6,775,178 | B2 * | 8/2004 | Liu et al. | 365/154 |
| 6,975,532 | B1 * | 12/2005 | Kosonocky et al. | 365/154 |
| 7,328,413 | B2 * | 2/2008 | Kim et al. | 716/1 |
| 7,508,697 | B1 * | 3/2009 | Mukhopadhyay et al. | 365/154 |
| 2002/0071305 | A1 * | 6/2002 | Lu et al. | 365/154 |
| 2006/0175606 | A1 * | 8/2006 | Wang et al. | 257/48 |
| 2007/0236985 | A1 * | 10/2007 | Edahiro et al. | 365/154 |

OTHER PUBLICATIONS

"Self-Calibration Technique for Reduction of Hold Failures in Low-Power Nano Scaled SRAM" Ghosh et al' Jul. 2006.*
"A 256kb Sub-Threshold SRAM in 65nm CMOS" Calhoun et al; IEEE International Solid State Circuits Conference; Feb. 2006.*

* cited by examiner

*Primary Examiner*—Tan T. Nguyen
(74) *Attorney, Agent, or Firm*—William F. Bahret

(57) ABSTRACT

A Schmitt Trigger (ST) based, fully differential, 10-transistor (10T) SRAM (Static Random Access Memory) bitcell suitable for sub-threshold operation. The Schmitt trigger based bitcell achieves 1.56× higher read static noise margin (SNM) ($V_{DD}$=400 mV) compared to a conventional 6T cell. The robust Schmitt trigger based memory cell exhibits built-in process variation tolerance that gives tight SNM distribution across the process corners. It utilizes fully differential operation and hence does not require any architectural changes from the present 6T architecture. The 10T bitcell has two cross-coupled Schmitt trigger inverters which each consist of four transistors, including a PMOS transistor and two NMOS transistors in series, and an NMOS feedback transistor which is connected between the inverter output and the junction between the series-connected NMOS transistors. Each inverter has one associated NMOS access transistor.

8 Claims, 17 Drawing Sheets

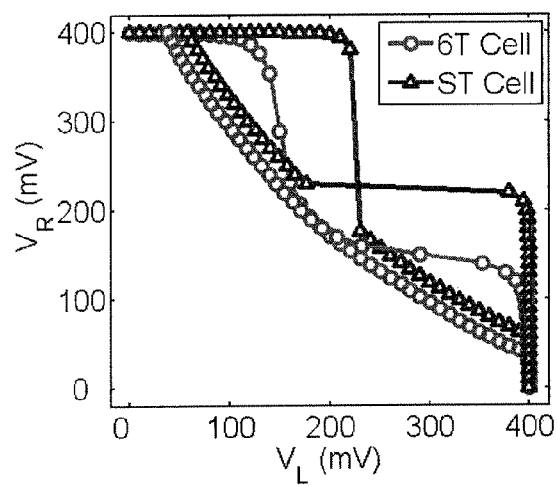 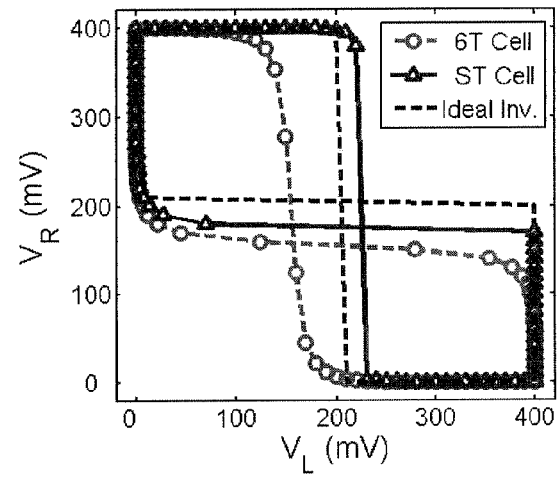
FIG. 4A    FIG. 4B
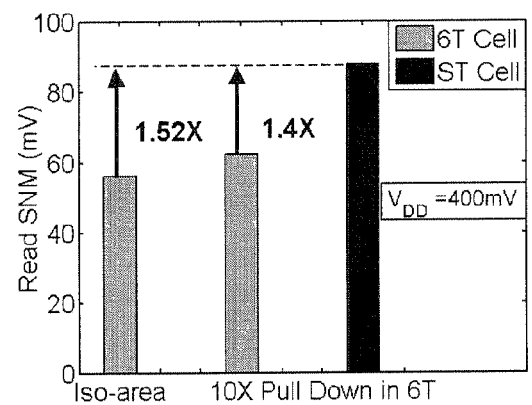
FIG. 5

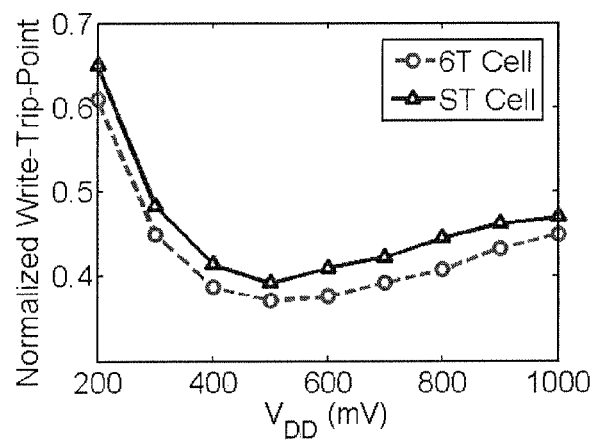
FIG. 6
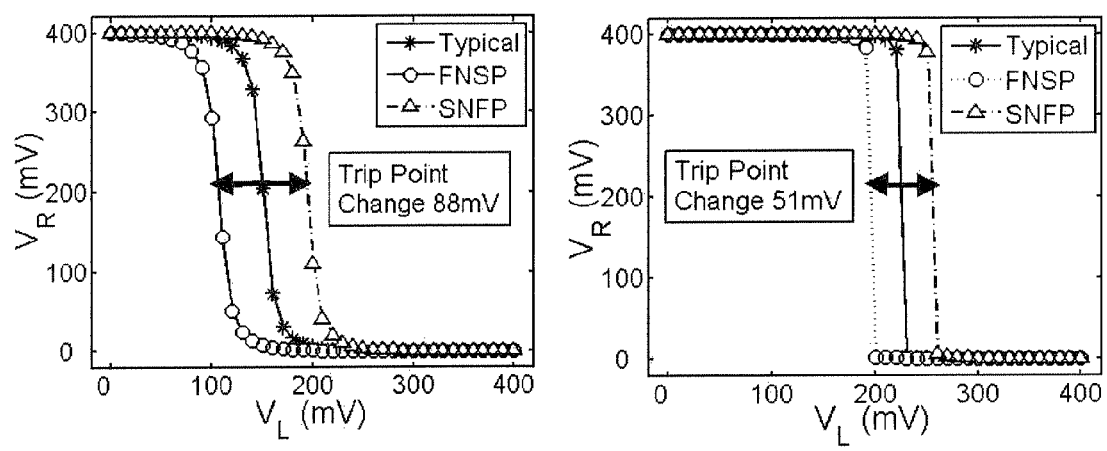
FIG. 7A
FIG. 7B

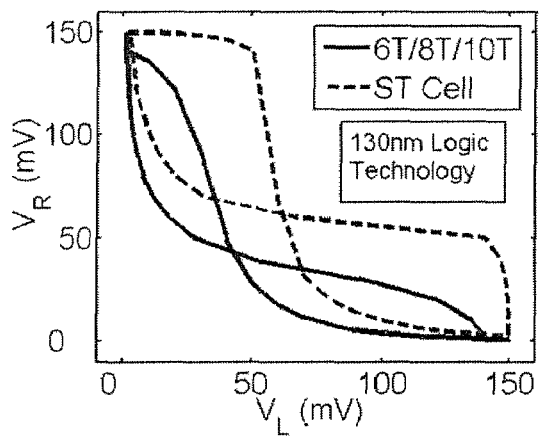 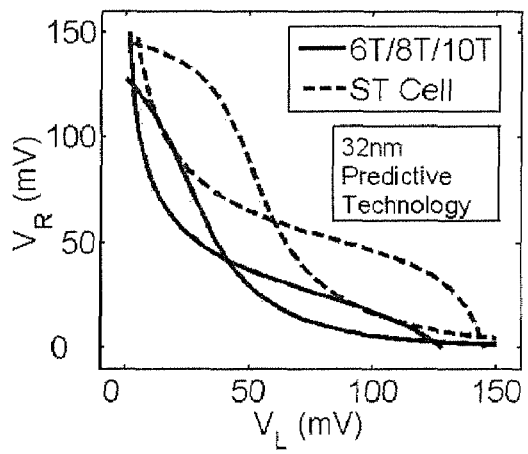
FIG. 13A  FIG. 13B
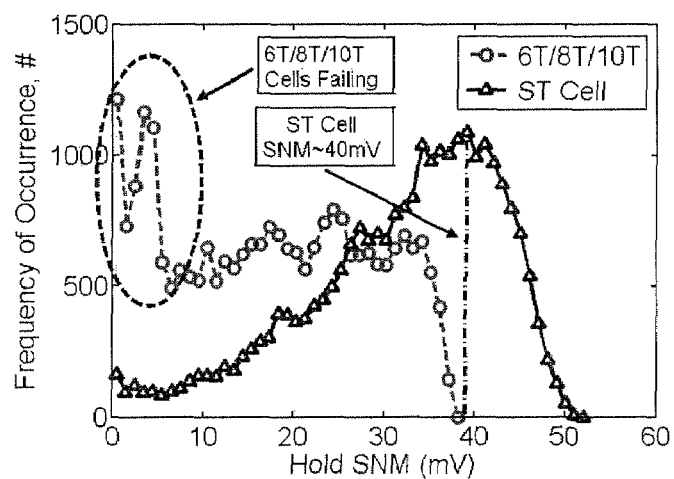
FIG. 14

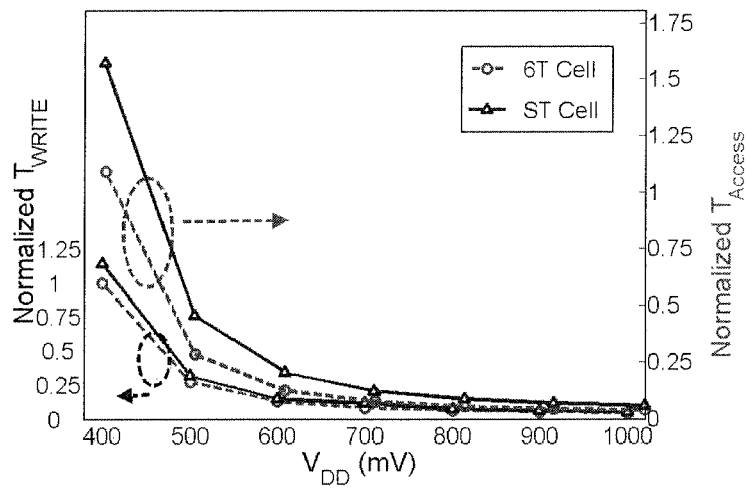
FIG. 15
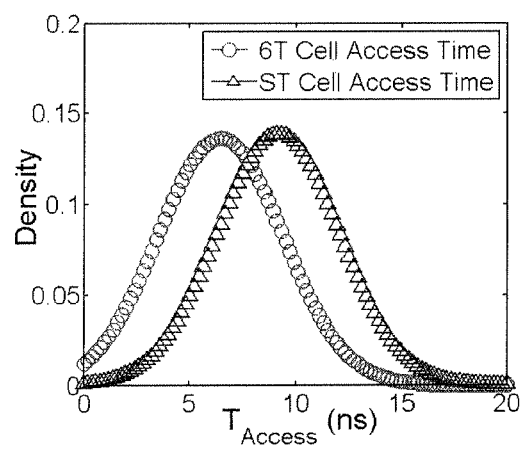 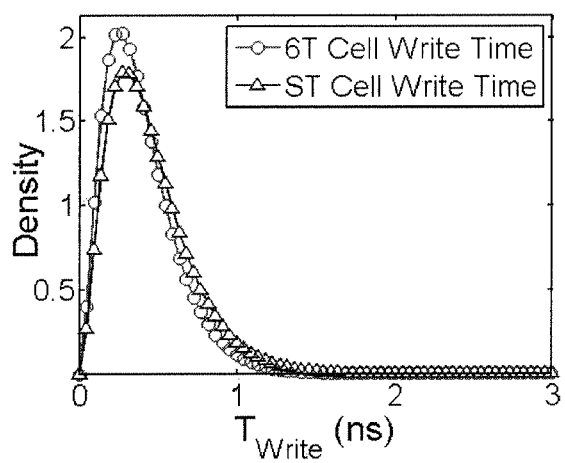
FIG. 16A
FIG. 16B

MEMORY CELL WITH BUILT-IN PROCESS VARIATION TOLERANCE

CROSS-REFERENCE TO RELATED APPLICATION

This application claims the benefit of U.S. Provisional Patent Application No. 60/891,830, filed Feb. 27, 2007.

BACKGROUND OF THE INVENTION

Aggressive scaling of transistor dimensions with each technology generation has resulted in increased integration density and improved device performance. Unfortunately, leakage current increases with the reduction of the device dimensions. Increased integration density along with the increased leakage necessitates ultra-low power operation in the present power-constrained design environment. The power requirement for battery operated devices such as cell phones and medical devices is even more stringent. Reducing the supply voltage reduces the dynamic power quadratically and leakage power linearly to the first order. Hence, supply voltage scaling has remained the major focus of the low power design. This has resulted in circuits operating at a supply voltage lower than the threshold voltage of a transistor. However, as the supply voltage is reduced, the sensitivity of the circuit parameters to process variations increases. Process variations limit the circuit operation in the sub-threshold region, particularly in memories, as discussed, for example, in the following paper: A. Bhavnagarwala et al., "The Impact of Intrinsic Device Fluctuations on CMOS SRAM Cell Stability," *IEEE Journal of Solid-State Circuits*, vol. 36, pp. 658-665, April 2001. Embedded cache memories are expected to occupy 90% of the total die area of a system-on-a-chip. Nano-scaled SRAM bitcells having minimum sized transistors are vulnerable to inter-die as well as intra-die process variations. Intra-die process variations include random dopant fluctuation (RDF), line edge roughness (LER) etc. This may result in a threshold voltage mismatch between the adjacent transistors in a memory cell. Coupled with inter-die and intra-die process variations, lower supply voltage operation results in various memory failures, i.e., read failure, hold failure, access time failure and write failure. See, e.g., S. Mukhopadhyay et al., "Modeling of Failure Probability and Statistical Design of SRAM Array for Yield Enhancement in Nanoscaled CMOS," *IEEE Transactions on Computer Aided Design*, pp. 1859-1880, December 2005. Memory failure probability is predicted to be higher in the future technology nodes.

Adaptive circuit techniques such as source biasing, dynamic $V_{DD}$ have been proposed to improve the process variation tolerance, as discussed by H. Kawaguchi et al. in "Dynamic Leakage Cutoff Scheme For Low-Voltage SRAMs," *VLSI Circuit Symposium, pp. 140-141*, June 1998. Self-calibration techniques to achieve low voltage operation while keeping the failure probability under control are also proposed. See, e.g., S. Ghosh et al, "Self-Calibration Technique for Reduction of Hold Failures in Low-Power Nano-Scaled SRAM," *Proc. of 43rd Design Automation Conference*, pp. 971-976, July 2006.

A 6-transistor (6T) cell which uses a cross-coupled inverter pair is the "de facto" memory bitcell used in current SRAM designs. A typical 6T cell has four MOSFET transistors arranged to form the cross-coupled inverters, and two additional MOSFET transistors which serve to control access to the cell during read and write operations. One such example is shown in U.S. Pat. No. 7,328,413 to Kim et al., issued Feb. 5, 2008, to the assignee of the present invention. The patent discloses a 6T SRAM cell with an added sleep transistor to reduce leakage and increase read stability. FIG. 1 herein also illustrates a typical 6T cell configuration, with the cross-coupled inverters and with the two access transistors electrically connecting the inverter pair to respective bit lines (BL), and with a word line (WL) that controls the access transistors. Different types of SRAM bitcells have been proposed to improve the memory failure probability at a given supply voltage (FIG. 1). 6T and 7T bitcells utilize differential read operation while 5T, 8T and 10T bitcells employ single ended reading scheme. 8T and 10T cells use an extra sensing circuit for reading the cell contents; achieving improved read SNM. A comparison of various SRAM bitcells is shown in TABLE 1.

TABLE 1

Comparison of various SRAM bitcells

| | | | Sr. No. | | |
|---|---|---|---|---|---|
| | 5T | 6T | 7T | 8T | 10T |
| Read | Single Ended | Differential | Differential | Single Ended | Single Ended |
| #WL | 1 | 1 | 1 | 2 | 2 |
| #BL | 1 | 2 | 2 | 3 | 3 |
| Area | 0.8 | 1 | — | 1.3 | 1.66 |
| #PMOS | 2 | 2 | 2 | 2 | 3 |
| #NMOS in Read Path | 2 | 2 | 2 or 3 | 2 | 3 |

Further details regarding 5T, 7T, 8T and 10T bitcells may be found in the following papers, respectively:

1. Carlson et al., "A High Density, Low Leakage, 5T SRAM for Embedded Caches," *Proc. of 30th European Solid State Circuits Conference*, pp. 215-218, September 2004.
2. R. Aly et al., "Novel 7T SRAM Cell for Low Power Cache Design," *Proc. of IEEE SOC Conference*, pp. 171-174, 2005.
3. Chang et al., "Stable SRAM Cell Design for the 32 nm Node and Beyond," *Symposium on VLSI Technology*, pp. 128-129, 2005.
4. B. H. Calhoun et al., "A 256 kb Sub-threshold SRAM in 65 nm CMOS," *Proc. of International Solid State Circuits Conference*, pp. 628-629 & 678, February 2006.

In spite of efforts by various groups, a need remains for improvements in SRAM technology. More specifically, a need remains for mechanisms and techniques for improving the stability of the inverter pair in a SRAM bitcell operating at lower supply voltages.

SUMMARY OF THE INVENTION

The present invention provides a semiconductor memory cell with built-in process variation tolerance. One aspect of the invention comprises a pair of cross-coupled inverters each having first and second series-connected transistors, an access transistor electrically connected to at least one of the inverters, and a feedback mechanism for changing the switching threshold of at least one of the inverters in response to an input transition.

A more particular aspect of the invention is an SRAM bitcell with built-in process variation tolerance. The SRAM bitcell comprises a pair of cross-coupled Schmitt trigger inverters, a memory cell access transistor electrically connected to each of said Schmitt trigger inverters, a first bit line connected to one of said Schmitt trigger inverters through a first of said access transistors, a second bit line connected to the other of said Schmitt trigger inverters through a second of said access transistors, and a word line connected to control inputs for both access transistors.

The SRAM bitcell according to the present invention is more stable than other SRAM bitcells at lower supply voltages, in that it is less sensitive to process variations. A preferred embodiment of the invention is a Schmitt trigger based, fully differential, 10-transistor (10T) SRAM bitcell having built-in feedback mechanism for improved process variation tolerance. It requires no architectural change compared to the present 6T cell architecture.

It has been demonstrated that with respect to 6T cell, the Schmitt trigger based bitcell of the present invention gives better read stability, better write-ability, improved process variation tolerance, lower read failure probability, low voltage/low power operation and improved data retention capability at ultra low voltage. The technique has been validated with a test chip fabricated in 0.13 μm logic process technology. An SRAM array containing the novel memory bitcell is functional at 160 mV of supply voltage.

Other objects and advantages of the present invention will be more apparent upon reading the following detailed description in conjunction with the accompanying drawings.

BRIEF DESCRIPTION OF THE DRAWINGS

FIG. 4 shows inverter characteristics for a conventional 6T cell and for an SRAM cell according to the present invention, with $V_{DD}$=400 Mv: (A) Read mode, (B) Hold mode.

FIG. 5 is a graph of read SNM, iso-area comparison.

FIG. 6 is a graph of normalized write-trip-point vs. $V_{DD}$.

FIG. 7 is a switching threshold comparison for 0→1 input transition: (A) 6T bitcell, (B) ST bitcell.

FIG. 13 is a hold SNM Comparison, $V_{DD}$=150 mV: (A) 130 nm technology, (B) 32 nm technology.

FIG. 14 shows a hold SNM, Monte Carlo simulation, $V_{DD}$=150 mV.

FIG. 15 shows write time, access time vs. VDD. The delay values are normalized to $T_{WRITE}$ value (VDD=400 mV).

FIG. 16 shows $T_{ACCESS}/T_{WRITE}$ Monte Carlo simulation ($V_{DD}$=400 mV): (A) $T_{ACCESS}$ distribution, (B) $T_{WRITE}$ distribution.

DESCRIPTION OF PREFERRED EMBODIMENTS

Figure 1:
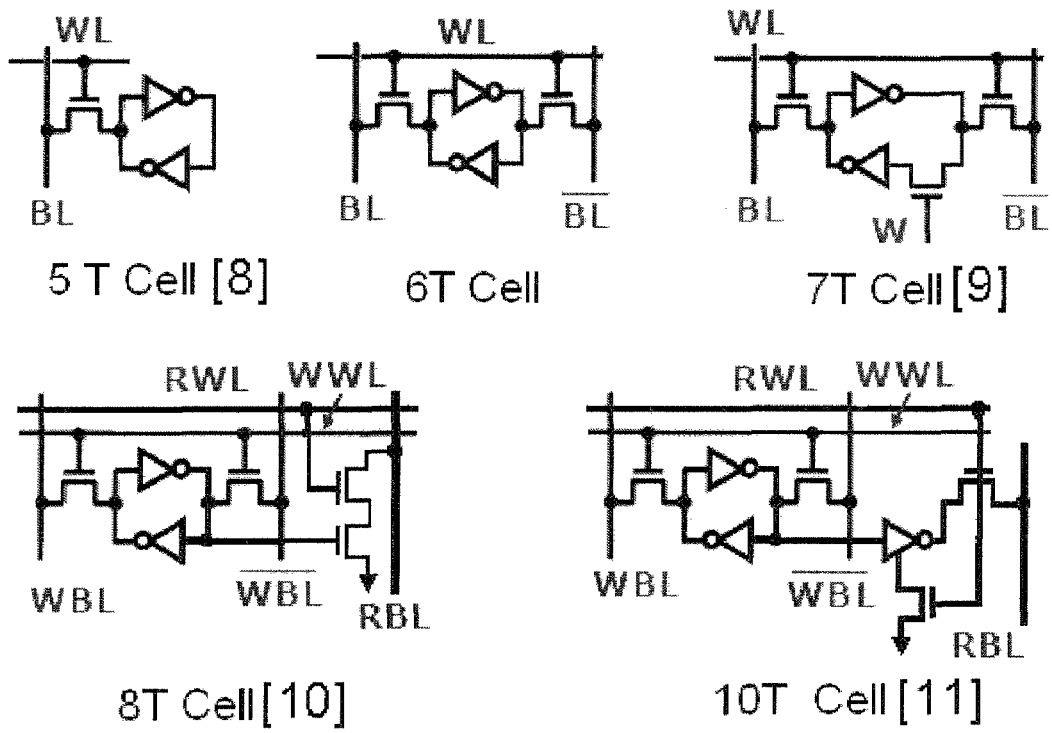
FIG. 1 illustrates various SRAM bitcell types.

For the purpose of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device and such further applications of the principles of the invention as illustrated therein being contemplated as would normally occur to one skilled in the art to which the invention relates.

Figure 2A:
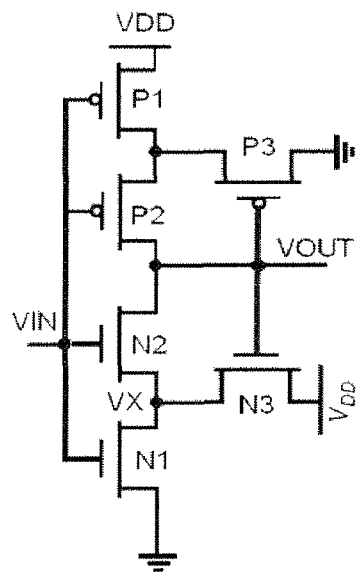
FIG. 2A is a schematic of a first embodiment of a Schmitt trigger (ST) inverter according to the present invention.
Figure 2B:
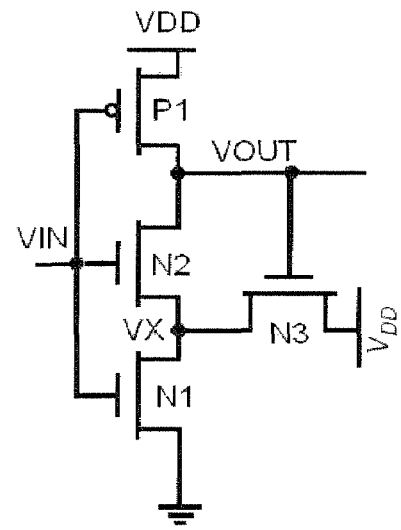
FIG. 2B is a schematic of a second embodiment of a Schmitt trigger inverter according to the present invention.

The Schmitt Trigger based (ST) 10 transistor SRAM cell focuses on making the basic inverter pair of the memory cell robust. At very low voltages, the cross-coupled inverter pair stability is of concern. To improve the inverter characteristics, a Schmitt trigger configuration is used. A Schmitt trigger is a device having dual threshold action, i.e., hysteresis. The device has a switching threshold which is higher for a positive-going input transition than for a negative-going input transition. This adaptation is achieved with the help of a feedback mechanism. One implementation of the Schmitt trigger is shown in FIG. 2A. This structure is used to form the inverter of one embodiment of a memory bitcell according to the present invention. The illustrated Schmitt trigger requires 6 transistors instead of 2 transistors to form an inverter. Thus it would need 14 transistors in total to form an SRAM cell, which would result in a large area penalty. Since PMOS transistors are used as weak pull-ups to hold the '1' state, a feedback mechanism in PMOS pull tip branch is preferably not used. A feedback mechanism is preferably used only in the pull-down path. Such a Schmitt trigger is shown in FIG. 2B.

Figure 3A:
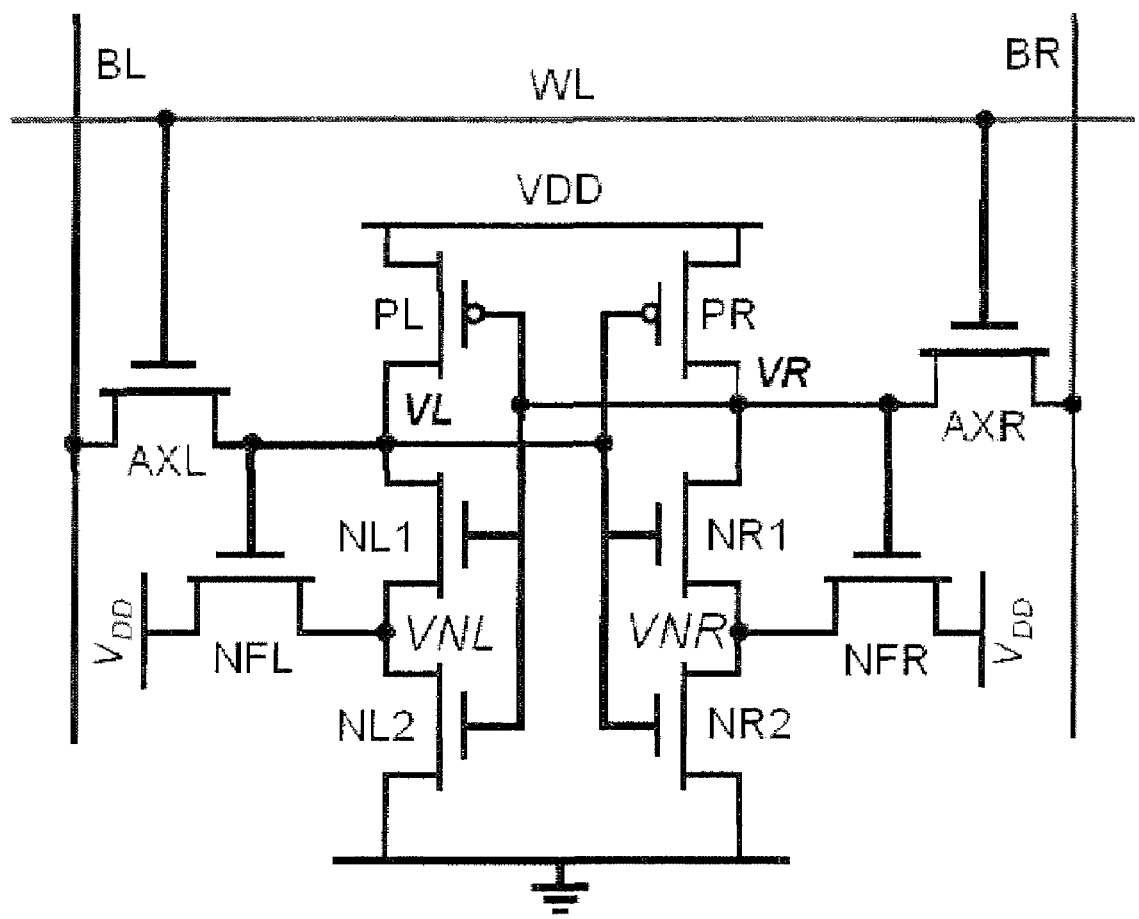
FIG. 3A is a schematic of a 10-transistor (10T) SRAM bitcell incorporating cross-coupled Schmitt trigger inverters of the type shown in FIG. 2B.

The complete schematic for the disclosed ST bitcell is shown in FIG. 3A. Transistors PL-NL1-NL2-NFL form one ST inverter while PR-NR1-NR2-NFR form another ST inverter. AXL and AXR are the access transistors. The positive feedback from NFL/NFR adaptively changes the switching threshold of the inverter depending on the direction of input transition. During a read operation (with, say, $V_L$=0 and $V_R=V_{DD}$), due to voltage divider action between the access transistor and the pull-down NMOS, the voltage of the $V_L$ node rises. If this voltage is greater than the switching threshold (trip point) of the other inverter, the contents of the cell can get flipped resulting in a read failure event. See, e.g., the above-referenced paper by S. Mukhopadhyay et al. In order to avoid a read failure, the feedback mechanism advantageously increases the switching threshold of the inverter PR-NR1-NR2. Transistors NFR and NR2 raise the voltage at node $V_{NR}$ and increase the switching threshold of the inverter storing '1'. Thus Schmitt trigger action is used to preserve the logic '1' state of the memory cell. The ST bitcell preferably utilizes differential operation giving better noise immunity. It requires no architectural change compared to the conventional 6T cell architecture.

Figure 3B:
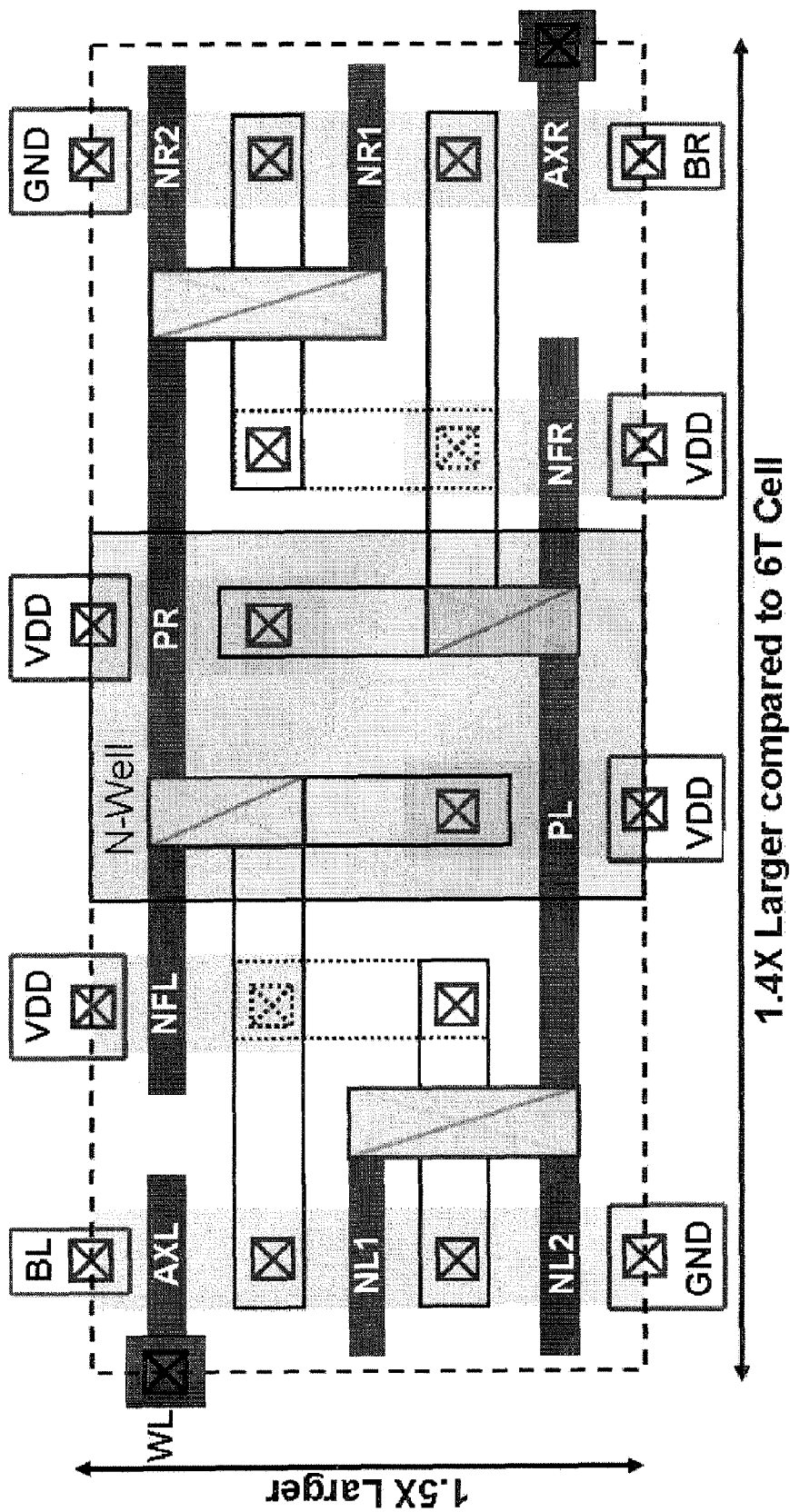
FIG. 3B shows a bitcell layout for the Schmitt trigger based SRAM of FIG. 3A.

The disclosed ST bitcell has 2 PMOS transistors and 8 NMOS transistors. As the number of PMOS transistors is the same as the 6T cell, the N-well area consumed by the ST bitcell could be the same as the conventional 6T cell. FIG. 3B shows one possible "thin cell" layout for the ST bitcell. A conventional 6T cell requires 4 columns of active regions, whereas the ST bitcell requires 5 columns of active region. The extra column of active region has minimum width. Pull-up transistors PL and PR share the same N-well. The vertical dimension is 2 Poly-pitch, consistent with the current 6T thin cell layout. The horizontal dimension is increased by approximately 34%. $V_{DD}$ and $V_{GND}$ contacts are shared between neighboring cells. The extra active column with the associated spacing consumes approximately 34% more area compared to the conventional 6T cell.

Simulation Results

HSPICE simulations have been done using 0.13 μm logic process technology. A typical NMOS (PMOS) $V_T$ is 350 mV (300 mV). 6T/8T/10T and the proposed ST bitcell are compared for various SRAM metrics. For the 6T cell, the transistor widths $W_{PU}/W_{AX}/W_{PD}$ are 160 nm/240 nm/320 nm respectively. For the ST bitcell, extra transistors NFL/NL2 are of minimum width (160 nm) while other transistors have the same dimensions as the 6T cell.

Read Stability

For improving cell stability, the proposed ST bitcell focuses on making the inverter pair robust. Feedback transistors NFL/NFR increase the inverter switching threshold whenever the node storing '1' is discharged to the '0' state. Thus cell asymmetry changes based on the direction of the node voltage transition. FIG. 4B shows the inverter characteristics indicating the cell asymmetry. When $V_L$ is increased from 0 to $V_{DD}$, the other node ($V_R$) makes a transition from $V_{DD}$ to 0. During this time, the feedback mechanism due to NFR-NR2 raises the node voltage $V_{NR}$ and tries to maintain the logic '1' state of the $V_R$ node.

This gives a very desirable inverter characteristic for robust memory cell operation. Static Noise Margin (SNM) is estimated graphically as the length of the side of the largest square that can be embedded inside the lobes of a butterfly curve, as described in the following paper: E. Seevinck et al., "Static noise margin analysis of MOS SRAM cells," *IEEE J Solid-State Circuits*, vol. SC-22, no. 5, pp. 748-754, October 1987. The ST bitcell has 1.56× improvement in the read SNM, compared to the conventional 6T counterpart, shown in FIG. 4A ($V_{DD}$=400 mV).

Since the disclosed ST bitcell consumes more area (~34%) compared to the 6T cell, it is worthwhile to compare these cells under "iso-area" condition. For iso-area condition, the cell ratio ($W_{PD}/W_{AX}$) in the 6T cell is increased so as to have same area as the ST bitcell. Under iso-area condition, the 'minimum sized' ST bitcell gives 1.52× improvement in read SNM than the 6T cell ($V_{DD}$=400 mV) as shown in FIG. 5. At higher supply voltages (i.e., in super-threshold regime), the drain current varies approximately linearly with the gate voltage. Transistor upsizing increases the SNM considerably. However, in the sub-threshold regime, drain current depends exponentially on the gate voltage. Any device upsizing will result in marginal change in the drain current. Thus in the sub-threshold region, SNM is relatively independent of the device sizing. Even with 10× increased cell ratio ($W_{PD}/W_{AX}$) in the 6T cell, the disclosed 'minimum area' ST bitcell shows 1.4× improvement in the read SNM shown in FIG. 5. This shows that, for a stable SRAM cell operating at a lower supply voltage, a feedback mechanism can be more effective than simple transistor upsizing as in a conventional 6T cell.

Write-Ability

Write-ability of a bitcell gives an indication on how easy or difficult it is to write to the cell. Write-trip-point defines the maximum bitline voltage ($V_{BL}^{MAX}$) needed to flip the cell content. The higher the bitline voltage, the easier it is to write to the cell. Normalized write-trip-point is defined as:

$$\text{Normalized-Write-Trip-Point} = \left[ \frac{V_{BL}^{MAX}}{V_{DD}} \right]$$

Initially consider $V_L$='0' and $V_R$='1'. In order to write a '0' to node $V_R$, BR is pulled down to ground, BL is kept at $V_{DD}$ and the word line is turned ON. The voltage at node $V_R$ is determined by the size of the pull-up transistor (PR) and the access transistor (AXR). The other node $V_L$ is transitioning from '0' state to '1' state. During this transition, the feedback transistor (NFL) is OFF. This results in the reduced pull-down transistor strength at node $V_L$ due to stacked (series-connected NL1-NL2) NMOS transistors. Compared to the 6T cell, the effective strength of pull-down transistor is reduced in the ST bitcell during a 1→0 input transition. Hence, the node storing '0' ($V_L$) gets flipped at a much higher voltage giving higher write-trip-point compared to the 6T cell as shown in FIG. 6. Unlike the conventional 6T cell, the ST bitcell gives better read stability as well as better write-ability. Schmitt trigger action gives better read stability while reduced pull-down strength (series connected NMOS) and absence of feedback during 1→0 input transition enables the ST bitcell to achieve better write-ability than the 6T cell.

Process Variation Tolerance

The disclosed ST bitcell has a built-in process variation tolerance. FIG. 7 shows the inverter voltage transfer characteristics (during a 0→1 input transition) for a standard 6T cell and the ST bitcell for typical and skewed process corners. (FNSP=Fast NMOS, Slow PMOS; SNFP=Slow NMOS and fast PMOS). As $V_L$ varies from $V_{GND}$ to $V_{DD}$, the feedback transistor NFR raises the node voltage $V_{NR}$ above $V_{GND}$. It increases the switching threshold when $V_R$ is transitioning from '1' state to '0' state. This results in sharp inverter characteristics as shown in FIG. 7B. In a Fast NMOS process corner, the threshold voltage of NMOS (NFR) would reduce. This would increase the intermediate node voltage ($V_{NR}$) closer toward $V_{DD}$ and would increase the switching threshold of the inverter. Similarly, for a slow NMOS corner, NMOS (NFR) $V_T$ would increase and switching threshold would be reduced. The variation in switching threshold is 51 mV in the ST bitcell compared to 88 mV in the 6T cell, indicating improved process variation tolerance (FIG. 7).

Figure 8A:
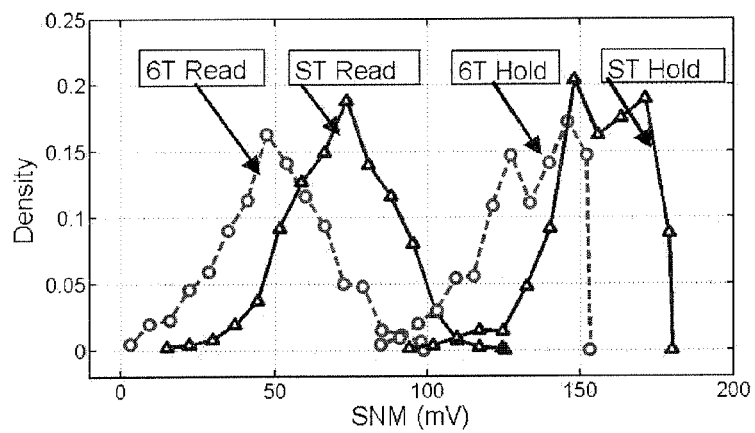
FIG. 8 shows SNM comparisons, Monte Carlo simulation: (A) Read/hold SNM distribution, (B) Mean SNM value, (C) Standard deviation in SNM.
Figure 8B:
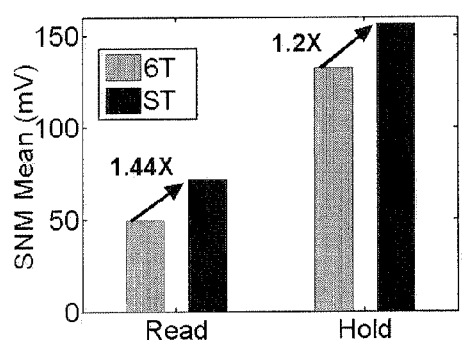
Figure 8C:
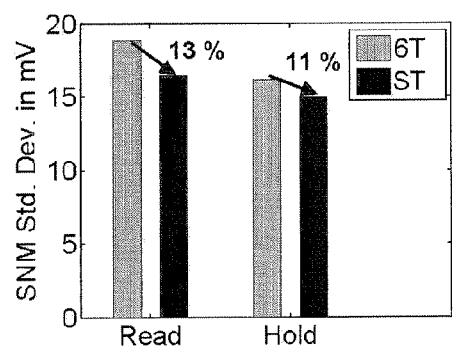

In order to evaluate the effectiveness of the ST bitcell under process variations, Monte-Carlo simulations ($V_{DD}$=400 mV) have been done for read and hold case. It has been observed that the ST bitcell gives higher mean read (hold) SNM 1.44× (1.22×) compared to the 6T cell as shown in FIG. 8. Further, the standard deviation in read (hold) SNM is reduced by 13% (11%) compared to the standard 6T cell ($V_{DD}$=400 mV).

Low Voltage/Low Power Operation

Figure 9:
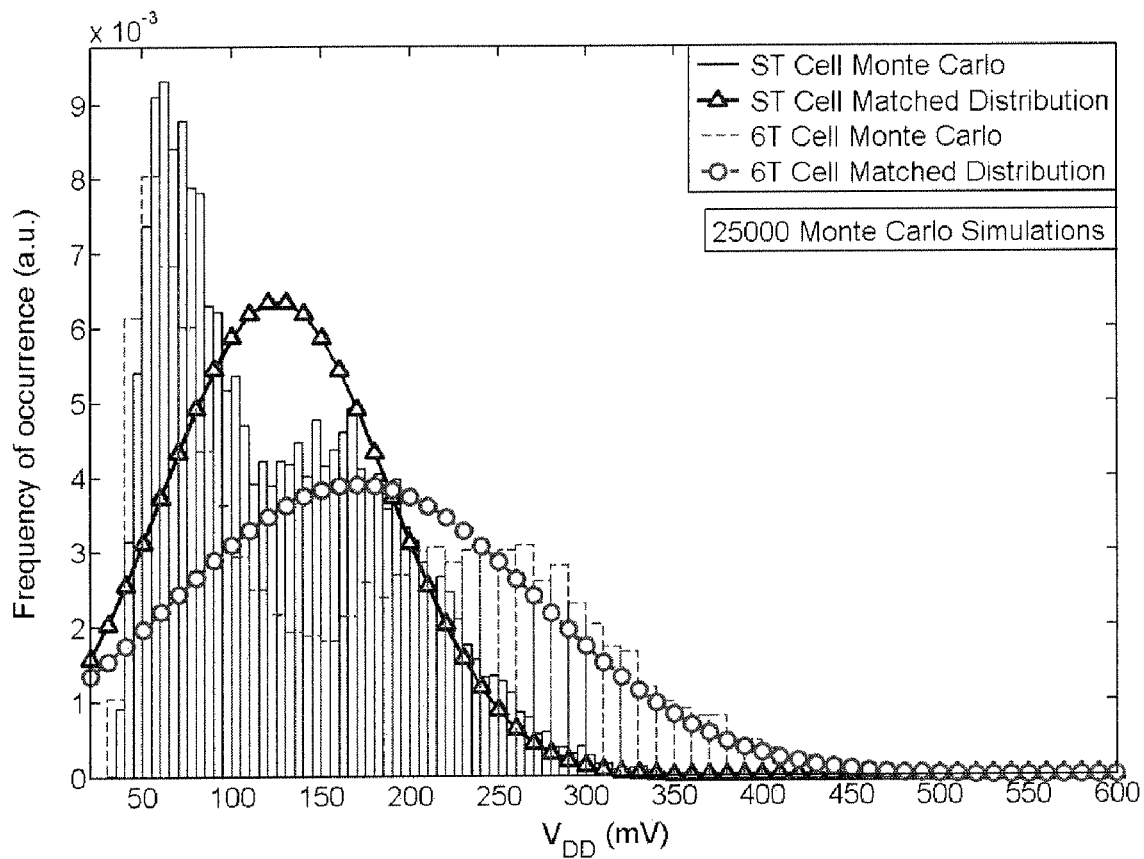
FIG. 9 shows a minimum $V_{DD}$ comparison, Monte Carlo simulation.

Supply voltage is reduced gradually from the nominal value of 1.0V to the point where memory cell contents are about to flip or reach a metastable point. For estimating the minimum $V_{DD}$ required during read operation, 25000 Monte Carlo simulations have been done. The distribution of minimum $V_{DD}$ required to avoid a read failure is shown in FIG. 9. The tail of the matched distribution is shown in the inset. The ST bitcell requires 24% lower average $V_{DD}$ with 39% reduced standard deviation than the 6T cell. Based on the minimum $V_{DD}$ distributions, cumulative distributive functions (CDF) are calculated and the minimum $V_{DD}$ required for a given read failure probability is estimated.

Figure 10:
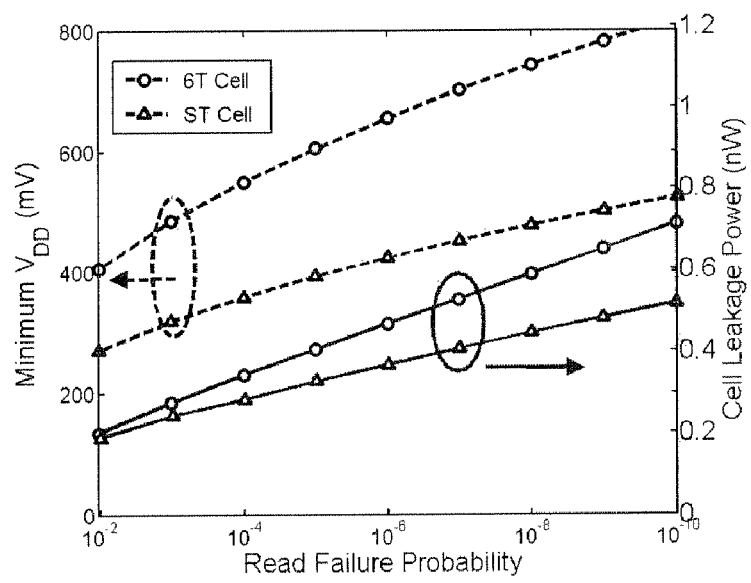
FIG. 10 shows leakage power and minimum $V_{DD}$ vs. read failure probability.

It is observed that, at iso-read-failure probability, the ST bitcell operates at a lower voltage than the conventional 6T cell. Minimum $V_{DD}$ versus the read failure probability is shown in FIG. 10. Due to reduced $V_{DD}$, the ST bitcell consumes lower leakage power compared to the 6T cell in spite of 4 extra transistors. As the access transistor size in the ST bitcell is the same as the 6T cell, the bit-line and word-line capacitance is unchanged. This reduces read/write dynamic power dissipation quadratically ($C_L V_{DD}^2 f$) with reduced $V_{DD}$. Note that the difference in 'minimum $V_{DD}$' increases as the read failure probability decreases.

Figure 11:
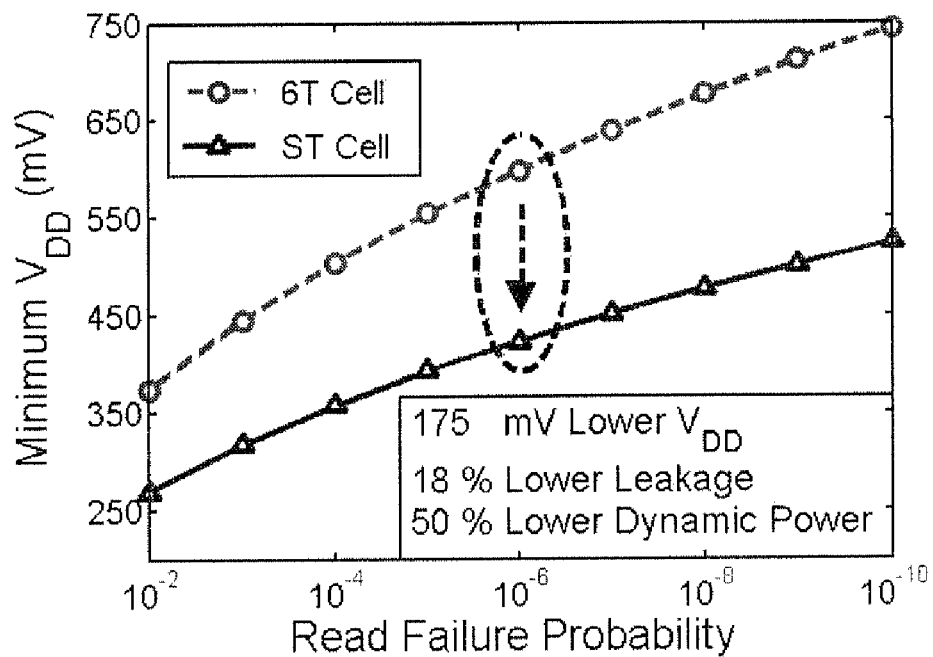
FIG. 11 shows an iso-area, iso-failure probability comparison.

Again, Monte Carlo simulations have been done for a read operation under "iso-area" condition. The minimum $V_{DD}$ required to avoid a read failure at iso-area and iso-read-failure probability (for this example $10^{-6}$) show that the ST bitcell operates at 175 mV lower supply voltage than the 6T cell. The ST bitcell operating at a lower supply voltage gives 18% saving in the leakage power and 50% savings in the dynamic power (at read failure probability of $10^{-6}$) as shown in FIG. 11.

Scalability

Figure 12:
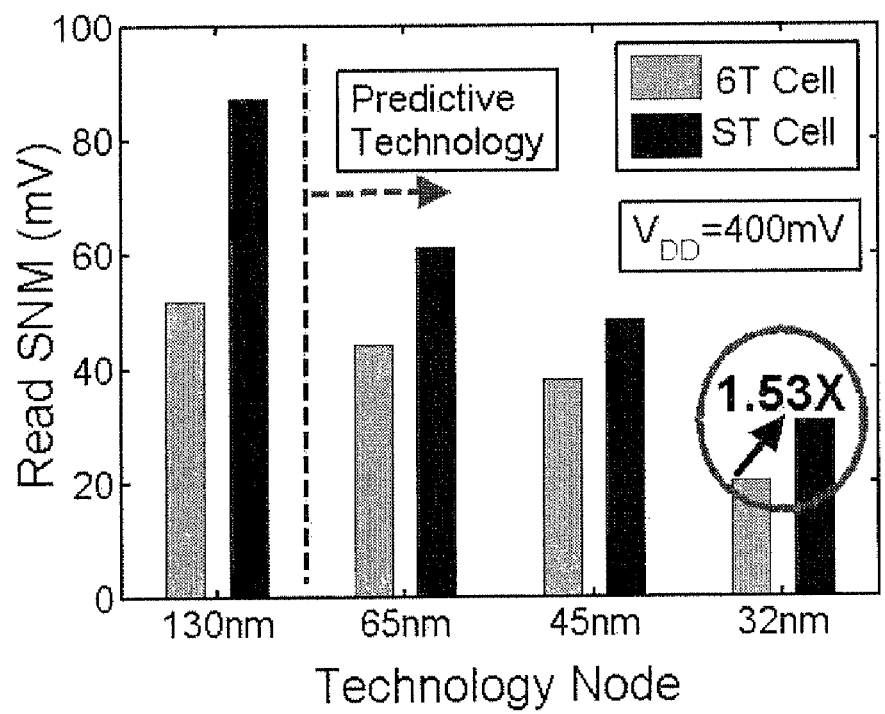
FIG. 12 shows a read SNM comparison for scaled technologies.

Using predictive technology models, the ST bitcell has been compared with the 6T cell to verify the effectiveness of the present technique in scaled technologies. Such models are described in a paper by W. Zhao et al. entitled "New Generation of Predictive Technology Model for Sub-45 nm Design Exploration," *Proc. of International Symposium on Quality Electronics Design*, pp. 585-590, 2006, and are available online at http://www.eas.asu.edu/~ptm/. The ST bitcell consistently predicts better read and hold SNM compared to the 6T cell in scaled technologies. For 32 nm technology, using predictive models, the ST bitcell predicts 1.53× improvement in read SNM compared to its 6T counterpart ($V_{DD}$=400 mV) shown in FIG. 12. Thus proposed ST bitcell can be scalable into future technologies. As technology scales, with increased process variations, the memory cell failure probability would worsen at lower supply voltages. In such a scenario, the present ST bitcell having built-in feedback mechanism would be useful for low $V_{DD}$ operation.

Ultra Low Voltage Operation

During the standby mode, the supply voltage of a memory array is reduced to minimize the leakage power. However, the supply voltage can not be reduced arbitrarily as memory bitcells would not be able to hold the contents of the cell. This voltage is termed as data retention voltage (DRV). 6T/8T/10T/ST bitcells are compared for Hold SNM at low supply voltages. As 6T, 8T and 10T cells use the same inverter pair, they would show almost the same characteristics in hold mode. FIG. 13 shows the inverter characteristics for 6T/8T/10T and the ST bitcell at ultra-low $V_{DD}$ (150 mV). It is clearly seen that the ST bitcell exhibits superior transfer characteristics than 6T/8T/10T cells. In 0.13 μm technology, the hold SNM for 6T/8T/10T cell is 18 mV, while the ST bitcell exhibits 42 mV hold SNM (2.3× better) (FIG. 13A). Similarly, for 32 nm technology node, the ST bitcell predicts more than a 2× improvement in the hold SNM (at $V_{DD}$=150 mV) compared to the 6T cell (FIG. 13B).

Thus the present ST bitcell may be useful for ultra-low voltage data retention in future nano-scaled technologies. The Monte Carlo simulations for the hold SNM are done at 150 mV $V_{DD}$ (25000 simulations). The hold SNM distribution for various cells is shown in FIG. 14. At 150 mV of $V_{DD}$, 6T/8T/10T cells no longer exhibit a Gaussian distribution, but a uniform distribution. Also, the hold failure probability is very high with many cells having hold SNM close to zero, indicating possible data flipping. The ST bitcell results in better hold SNM; close to $V_{DD}/4$. The SNM distribution for the ST bitcell is skewed towards the higher values. Due to built-in process variation tolerance (one NMOS (NFL/NFR) opposing another NMOS (NL1/NR1)), the distribution is tight. Also, the hold failure probability in the ST bitcell is very low compared with 6T/8T/10T cells.

This analysis points out the importance of the stability of a cross-coupled inverter pair for a robust SRAM bitcell operating at ultra-low voltages.

Access Time/Write Time

FIG. 15 shows the write/access time variations vs. $V_{DD}$. Access time ($T_{ACCESS}$) is estimated as the time required for developing a 50 mV bitline differential voltage after the word line is turned ON during a read operation. The ST bitcell incurs 60% longer access time than the 6T cell due to series-connected NMOS transistors in the pull-down path ($C_{BL}$=100 fF, $V_{DD}$=400 mV). Write time ($T_{WRITE}$) is estimated as the time required to flip the cell contents after the word line is turned ON, during a write operation. In the write mode, due to increased node capacitance, the ST bitcell exhibits 14% longer write time ($V_{DD}$=400 mV) than the 6T cell. It is observed that near the sub-threshold region, the ST bitcell requires ~100 mV higher supply voltage than the 6T cell to produce the same access/write time. For $V_{DD}$ higher than 500 mV, the delay penalty is marginal.

FIG. 16 shows the Monte Carlo simulation results (5000 runs) for access time ($T_{ACCESS}$) and write time ($T_{WRITE}$) ($C_{BL}$=100 fF, $V_{DD}$=400 mV). $T_{ACCESS}$ exhibits a Gaussian distribution while $T_{WRITE}$ shows a non-central F distribution shown in FIG. 16. For the read case, the ST bitcell shows a 42% higher average $T_{ACCESS}$ (due to 3 series-connected NMOS) than the 6T cell. Similarly for the write case, the ST bitcell incurs 14% higher average $T_{WRITE}$ than the 6T cell (due to increased node capacitance).

Measurement Results

Figure 17:
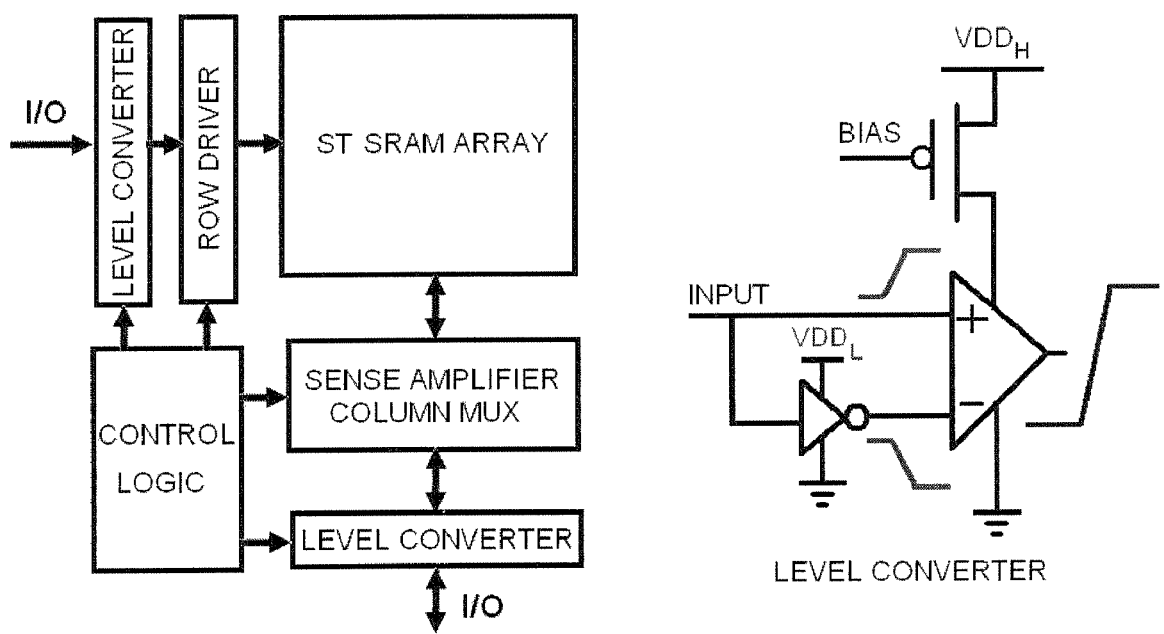
FIG. 17 illustrates an SRAM architecture, with level converter, according to the present invention.
Figure 18A:
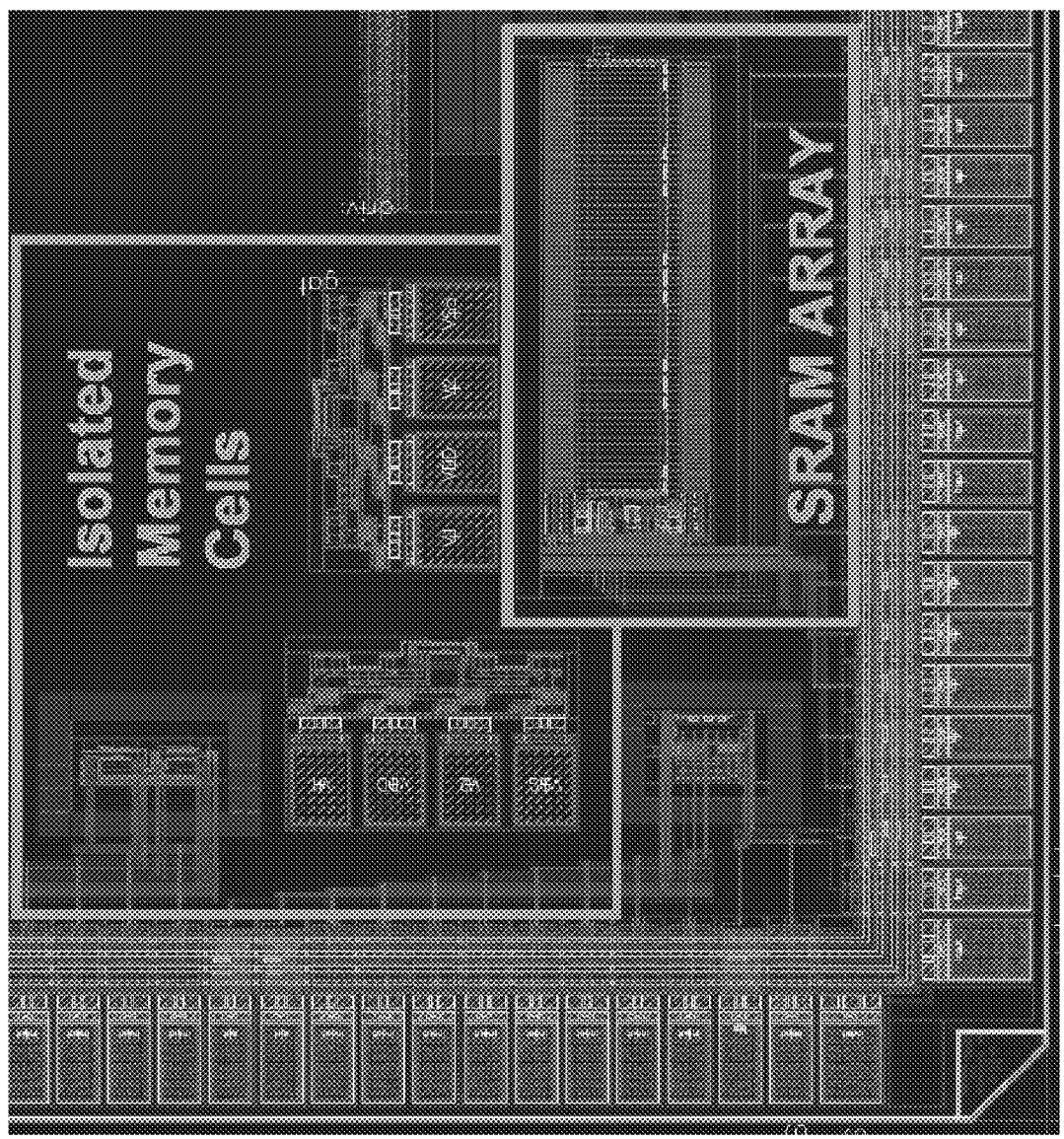
FIGS. 18A and 18B show the SRAM layout and the chip micrograph.
Figure 18B:
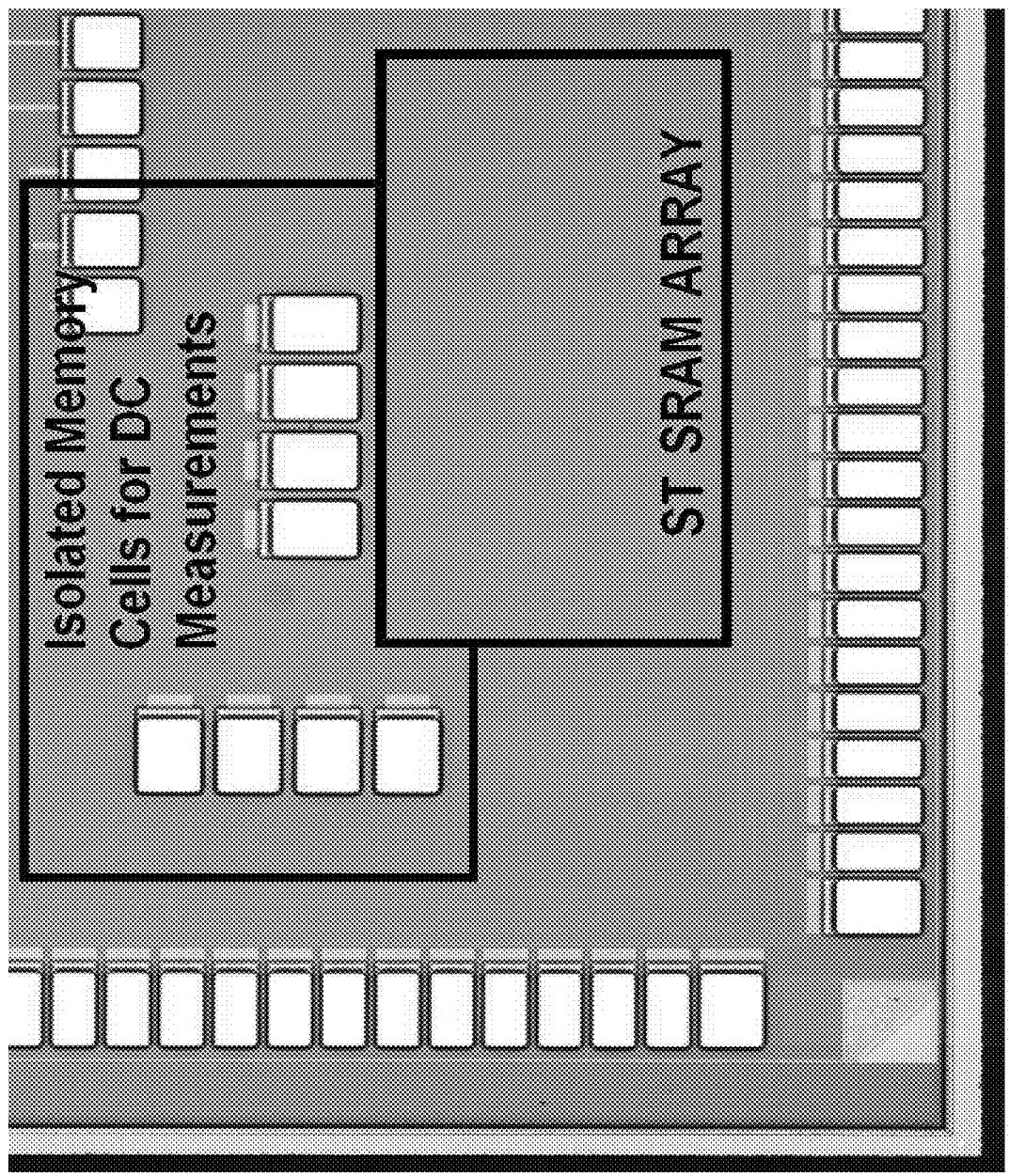

A test chip containing 256×16 cells (1 block) in a SRAM array has been fabricated using 0.13 μm CMOS technology. FIG. 17 shows the implemented SRAM architecture with the level conversion stage at I/O. A level shifter converts low $V_{DD}$ data (400 mV) to high $V_{DD}$ data (1.2V) to drive the package capacitance (~10-20 pF). The I/O buffers operating at lower voltage would require wide transistors to drive such load. The level converter consists of an operational amplifier (op-amp) operating in open-loop configuration and is driven by the complementary input signals (FIG. 17). In addition, buffers are implemented to bypass the level conversion stage in order to monitor various internal signals operating at low supply voltages. External control signals are provided to select either the level converter stage or the buffer chain. For SNM measurements, separate isolated 6T/ST memory bitcells with each transistor having 10 fingers are fabricated. The width of each finger is kept the same as the width of a bitcell transistor used in the SRAM array. As threshold voltage ($V_T$) depends on the width of the transistor, the finger structure would generate transistors having same $V_T$ as that used in the SRAM array. The transfer characteristics of a memory bitcell depends on "relative sizes" (or relative current driving capabilities) of the transistors. Increasing the number of fingers of all transistors equally would not change the transfer characteristics and hence would not alter SNM values. Guard rings and dummy transistors are used in the finger structure layout in order to minimize the effect of process bias. For isolated cell layout, several dummy NMOS acting as a capacitor with source/drain/substrate connected to ground and gate connected to the higher metal layers are used. These dummy NMOS are used for gate oxide protection (Antenna rule). FIGS. 18A and 18B show the SRAM layout and the chip micrograph.

Figure 19A:
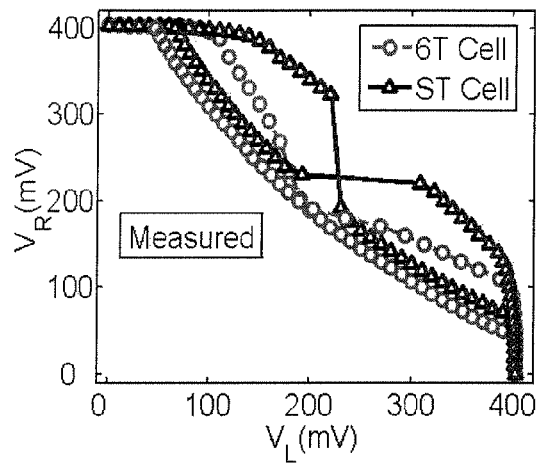
FIG. 19 shows read and hold SNM measurements, $V_{DD}$=400 mV: (A) Read mode, (B) Hold mode.
Figure 19B:
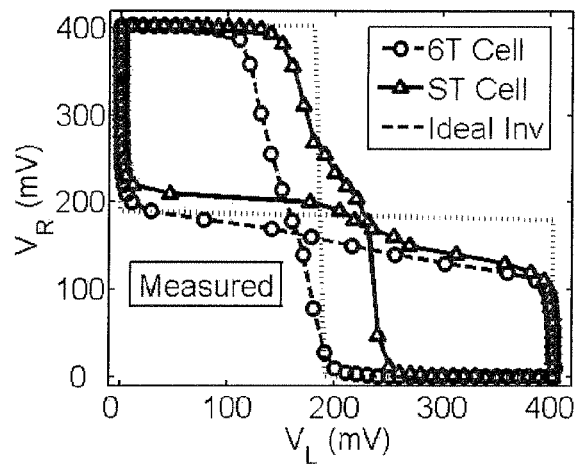
Figure 20A:
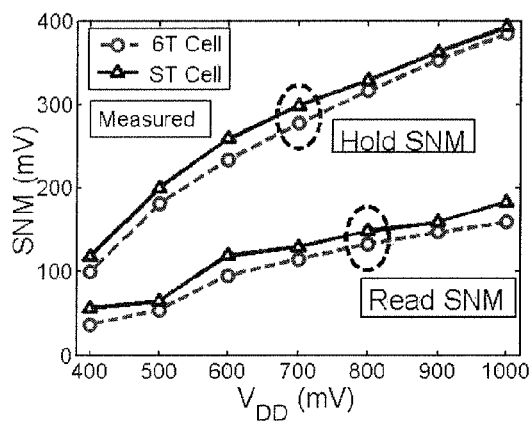
FIG. 20 shows measured read, hold SNM and normalized write-trip-point vs. $V_{DD}$: (A) Read/hold SNM, (B) Normalized write-trip-point.
Figure 20B:
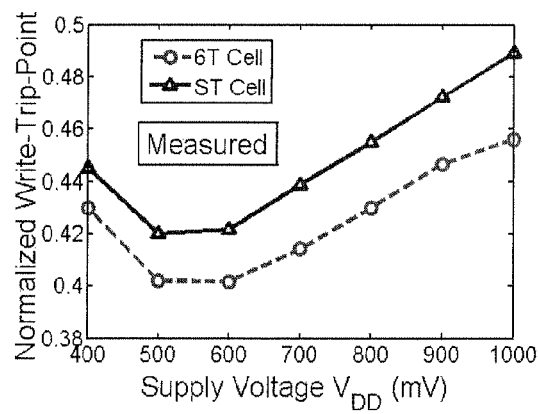

FIG. 19 shows the measured butterfly curves ($V_{DD}$=400 mV) for the read and hold case. The ST bitcell shows near-ideal inverter characteristics compared to the 6T cell as seen in the hold case. Thus the proposed ST bitcell consistently gives higher read and hold SNM for different supply voltages; shown in FIG. 20A. Measured SNM results match well with the simulation results. Write-trip-point is measured by first writing '1' to a node and then lowering the corresponding bitline voltage from $V_{DD}$ to the point where the contents of the memory cell are flipped (i.e. write-trip-point). The corresponding bitline voltage is normalized to $V_{DD}$. It is found that the write-trip-point in the ST bitcell is higher than 6T cell shown in FIG. 20B. Thus the ST bitcell clearly demonstrates improved read stability as well as improved write-ability than the 6T cell.

Figure 21:
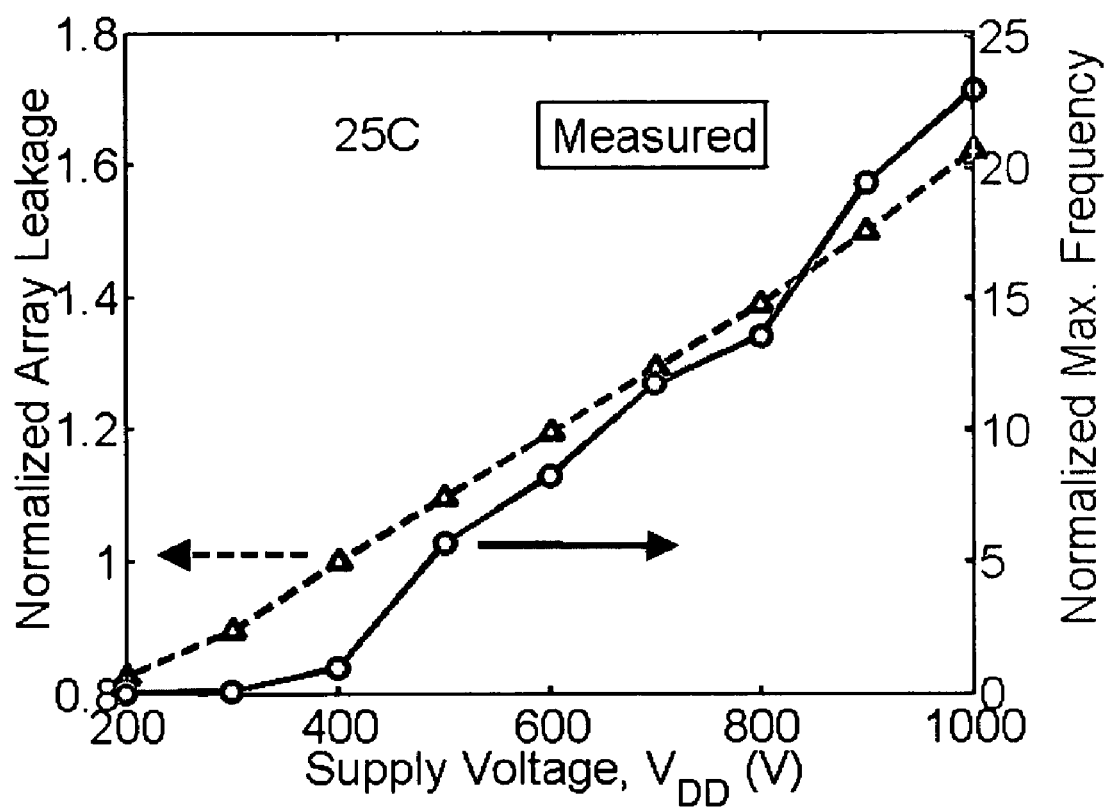
FIG. 21 shows measured leakage power and maximum frequency of operation vs. $V_{DD}$.
Figure 22:
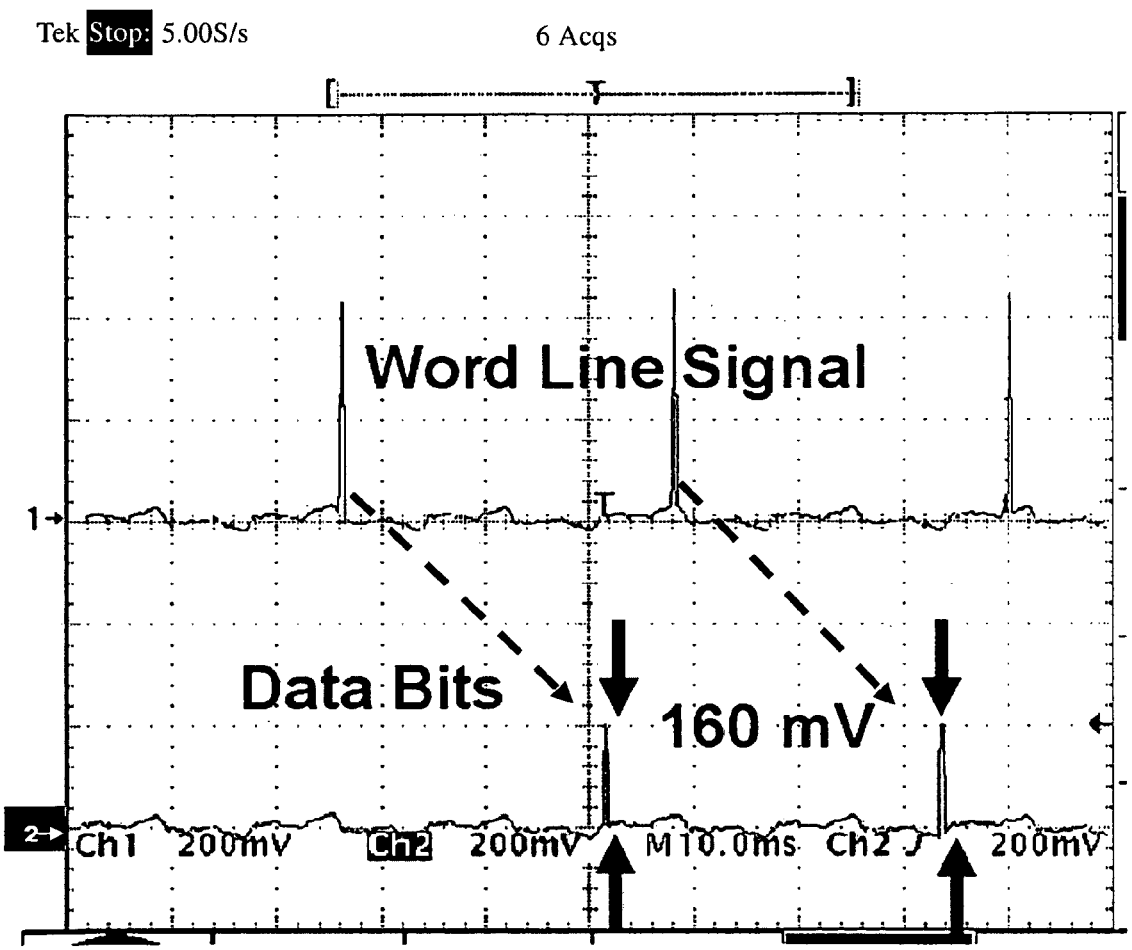
FIG. 22 shows word line and data bit waveforms for a 160 mV functional SRAM. The x-axis (time) unit is in ms, indicating a delay between the internal word line signal and the output data bits.

Array leakage power and the maximum frequency of operation have also been measured for various supply voltages. At 400 mV, the SRAM operates at 620 KHz consuming 0.146 µW. This includes the bias current of op-amps used in the level converter. FIG. 21 shows the variation of measured maximum frequency of operation and leakage power for different supply voltages. Maximum frequency and leakage power values are normalized to 400 mV $V_{DD}$ values. Bias voltage for the op-amp used in the level conversion stage is adjusted as the supply voltage is changed. Supply voltage is reduced gradually to verify the SRAM array functionality. Various rows in two different test chips are checked for the correct read operation. The ST bitcell array is functional at 160 mV as shown in FIG. 22. The data waveforms are captured by enabling the buffer chain in the I/O buffer. The level converter stage is bypassed in this case. The top waveform in FIG. 22 shows the monitored word line signal and the bottom waveform shows the observed data bits at the output pin. There is a significant delay (~25 ms) between the word line signal and the output data bit signal. We believe that it is due to 8 inverter pairs having thick oxide high $V_T$ transistors used in the I/O buffer, package/pin capacitance and oscilloscope input capacitance (~20 pF in total).

CONCLUSIONS

A Schmitt trigger based, fully differential, robust, 10-transistor SRAM bitcell suitable for sub-threshold operation has been described. The ST bitcell achieves higher read SNM (1.56×) compared to the conventional 6T cell ($V_{DD}$=400 mV). The robust memory cell exhibits built-in process variation tolerance that gives a tight SNM distribution across the process corners. It incorporates fully differential operation and hence it does not require any architectural changes from the present 6T architecture. At iso-area and iso-read-failure probability, the ST bitcell operates at a lower $V_{DD}$ with lower leakage and reduced read/write power. Simulation results show that the ST bitcell can retain the data at low supply voltage (150 mV). An SRAM array functional at 160 mV supply voltage has been demonstrated using 0.13 µm CMOS technology.

While the invention has been illustrated and described in detail in the drawings and foregoing description, the same is to be considered as illustrative and not restrictive in character, it being understood that only preferred embodiments have been shown and described and that all changes and modifications that come within the spirit of the invention are desired to be protected. All patents, patent applications and published papers cited herein are hereby incorporated by reference in their entireties.

APPENDIX

Schmitt Trigger Operation in Sub-Threshold Region

Figure 23:
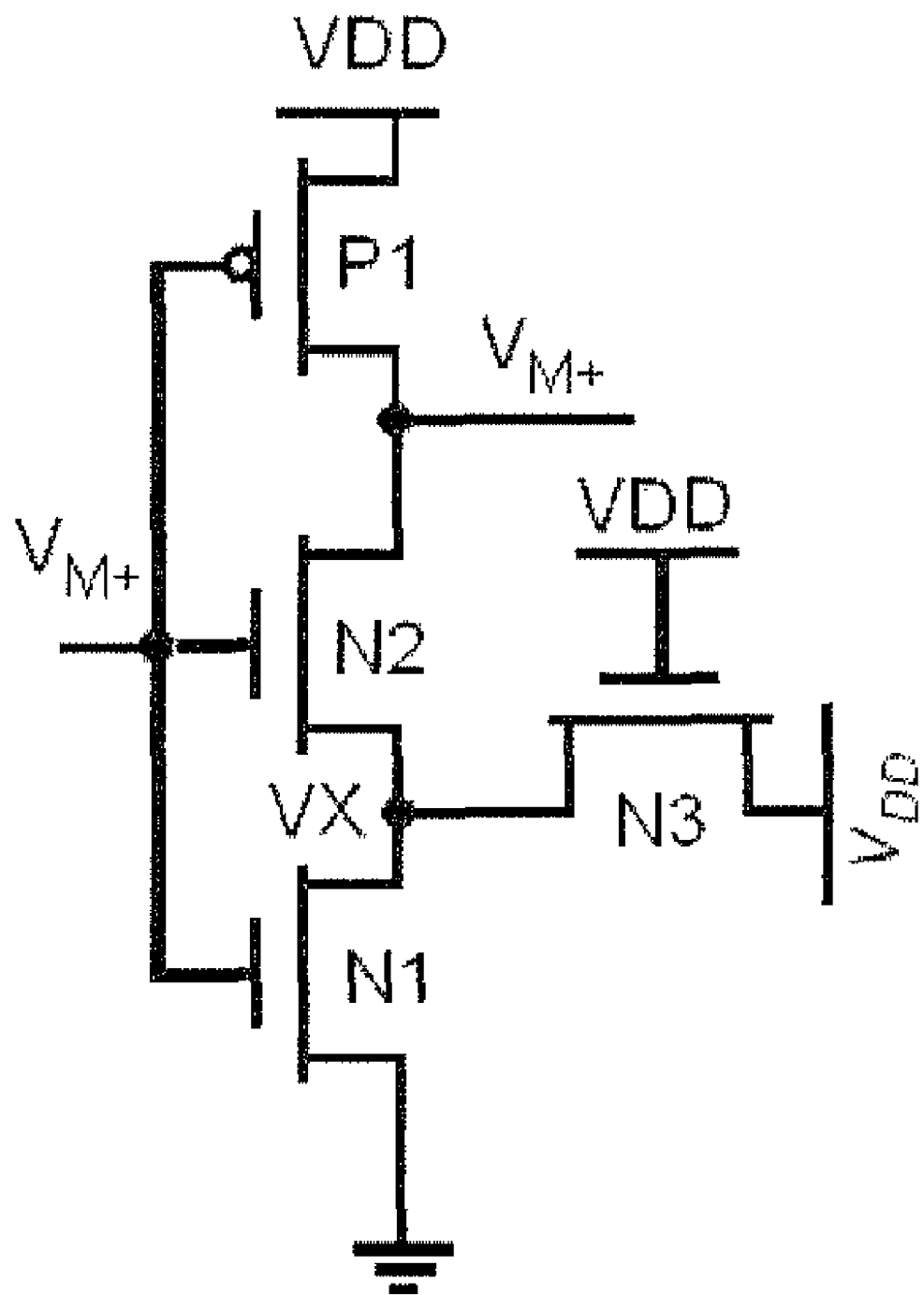
FIG. 23 shows a 0→1 input transition equivalent circuit.

To estimate the switching threshold ($V_{M+}$) during a 0→1 input transition, the feedback transistor is assumed to be ON with the gate connected to $V_{DD}$ as shown in FIG. 23. The feedback transistor N3 increases the intermediate node voltage $V_X$ whenever output is at $V_{DD}$. Drain current in sub-threshold region is given by:

$$I = \beta I_o \exp\left(\frac{-V_T}{mkT/q}\right) \cdot \exp\left(\frac{V_{GS}}{mkT/q}\right) \cdot \left(1 - e^{-V_{DS}/(kT/q)}\right) \quad (1)$$

$$V_T = V_{T0} - \eta V_{DS}$$

where $\beta$=transistor (W/L) ratio, $I_o$=process-specific current at $V_{GS}$=$V_{T0}$ for a transistor with W/L=1; T is the temperature in Kelvin, m is the body effect coefficient=(1+$C_{si}/C_{ox}$); $\eta$=DIBL (Drain Induced Barrier Lowering) coefficient;

If we define $$A = \beta I_o \exp\left(\frac{-V_{T0}}{mkT/q}\right),$$

drain current (I) can be written as $$I = A \cdot \exp\left(\frac{V_{GS} + \eta V_{DS}}{mkT/q}\right) \cdot \left(1 - e^{-V_{DS}/(kT/q)}\right) \quad (2)$$

Further, For $V_{DS}$>100 mV (~4 kT/q), the term $$\left(1 - e^{-V_{DS}/(kT/q)}\right)$$

can be ignored (<2% error at 300K). Thus simplified current expression in sub-threshold region as mentioned in (2) becomes, $$I = A \cdot \exp\left(\frac{V_{GS} + \eta V_{DS}}{mkT/q}\right) \qquad (3)$$

Using the equivalent circuit shown in FIG. 23, the switching threshold ($V_{M+}$) during a 0→1 input transition is estimated as follows.

At node $V_{OUT}$, $I_{P1} = I_{N2}$ $$A_{P1} \cdot \exp\left(\frac{(V_{DD} - V_{M+}) + \eta_{P1}(V_{DD} - V_{M+})}{m_{P1}kT/q}\right) = \qquad (4)$$

$$A_{N2} \cdot \exp\left(\frac{(V_{M+} - V_X) + \eta_{N2}(V_{M+} - V_X)}{m_{N2}kT/q}\right)$$

$$\therefore \frac{kT}{q} \ln\left(\frac{A_{P1}}{A_{N2}}\right) = \left(\frac{(1 + \eta_{N2})(V_{M+} - V_X)}{m_{N2}}\right) - \left(\frac{(1 + \eta_{P1})(V_{DD} - V_{M+})}{m_{P1}}\right)$$

$$\therefore V_x = \left(1 + \frac{m_{N2}(1 + \eta_{P1})}{m_{P1}(1 + \eta_{N2})}\right)V_{M+} -$$

$$\left(\frac{m_{N2}(1 + \eta_{P1})}{m_{P1}(1 + \eta_{N2})}\right)V_{DD} - \left(\frac{kT}{q}\right) \cdot \ln\left(\frac{A_{P1}}{A_{N2}}\right) \cdot \left(\frac{m_{N2}}{1 + \eta_{N2}}\right)$$

Let $\left(\frac{kT}{q}\right) \cdot \ln\left(\frac{A_{P1}}{A_{N2}}\right) \cdot \left(\frac{m_{N2}}{1 + \eta_{N2}}\right) = \alpha$ $$\therefore V_x = \left(1 + \frac{m_{N2}(1 + \eta_{P1})}{m_{P1}(1 + \eta_{N2})}\right)V_{M+} - \left(\frac{m_{N2}(1 + \eta_{P1})}{m_{P1}(1 + \eta_{N2})}\right)V_{DD} - \alpha \qquad (5)$$

If we assume $m_{P1} = m_{N2}$ and $\eta_{P1} = \eta_{N2}$ then, $V_X$ can be written as:

$$V_X = 2V_{M+} - V_{DD} - \alpha \qquad (5a)$$

At node $V_X$, $I_{N2} + I_{N3} = I_{N1}$ $$A_{N2} \cdot \exp\left(\frac{(V_{M+} - V_X) + \eta_{N2}(V_{M+} - V_X)}{m_{N2}kT/q}\right) + \qquad (6)$$

$$A_{N3} \cdot \exp\left(\frac{(V_{DD} - V_X) + \eta_{N3}(V_{DD} - V_X)}{m_{N3}kT/q}\right) =$$

$$A_{N1} \cdot \exp\left(\frac{V_{M+} + \eta_{N1}V_X}{m_{N1}kT/q}\right)$$

We assume $m_N = m_{N2} = m_{N3} = m_N$ and $\eta_{N1} = \eta_{N2} = \eta_{N3} = \eta_N$, Substituting the value of $V_X$ from (5a)

$$A_{N2} \cdot \exp\left(\frac{(1 + \eta_N) \cdot (V_{DD} - V_{M+} + \alpha)}{m_N kT/q}\right) + \qquad (7)$$

$$A_{N3} \cdot \exp\left(\frac{(1 + \eta_N) \cdot (2V_{DD} - 2V_{M+} + \alpha)}{m_N kT/q}\right) =$$

$$A_{N1} \cdot \exp\left(\frac{(1 + 2\eta_N)V_{M+} - \eta_N(V_{DD} + \alpha)}{m_N kT/q}\right)$$

Equation (7) can be solved numerically to obtain $V_{M+}$. It can be observed that factors $A_{N1}$, $A_{N2}$, $A_{N3}$ depend on NMOS process conditions and fairly track each other across the process corners. For example, at a fast NMOS process corner, fast N1 and N3 track fast N2 transistor characteristics. Therefore, Schmitt trigger action does give improved robustness against process variations even in the sub-threshold regime shown in FIG. 7. In addition, the switching threshold ($V_{M+}$) is raised using feedback as shown in FIG. 7B.

We claim:

1. A semiconductor memory cell with built-in process variation tolerance, comprising:
    a pair of cross-coupled inverters each having first and second series-connected transistors and each having a switching threshold;
    an access transistor electrically connected to a first of said inverters; and
    a feedback mechanism for changing the switching threshold of at least said first inverter in response to an input transition.

2. The memory cell of claim 1, wherein said feedback mechanism includes a feedback transistor with a control input connected to an output of said first inverter and an output connected to another terminal of one of said first and second transistors in said first inverter.

3. The memory cell of claim 2, wherein said feedback mechanism includes a second transistor which is connected in series with said feedback transistor and with one of said first and second transistors in said first inverter.

4. The memory cell of claim 3, wherein said feedback mechanism is further configured to change the switching threshold of the second of said inverters in response to an input transition, said feedback mechanism including a feedback transistor with a control input connected to an output of said second inverter and an output connected to another terminal of one of said first and second transistors in said second inverter, and a second transistor which is connected in series with said feedback transistor and with one of said first and second transistors in said second inverter.

5. The memory cell of claim 4, further comprising an access transistor electrically connected to said second inverter;
    wherein said inverters are CMOS devices, and said feedback mechanism transistors and said access transistor are all NMOS transistors.

6. An SRAM bitcell with built-in process variation tolerance, comprising:
    a pair of cross-coupled Schmitt trigger inverters, each including a PMOS transistor in series with two series-connected NMOS transistors;
    a memory cell access transistor electrically connected to each of said Schmitt trigger inverters;
    a first bit line connected to one of said Schmitt trigger inverters through a first of said access transistors;
    a second bit line connected to the other of said Schmitt trigger inverters through a second of said access transistors; and
    a word line connected to control inputs for both access transistors.

7. The SRAM bitcell of claim 6, wherein said Schmitt trigger inverters each include an NMOS feedback transistor, said feedback transistor having a gate connected to a junction between said PMOS transistor and said series-connected NMOS transistors, a source connected to a junction between said series-connected NMOS transistors, and a drain connected to a voltage supply line.

8. The SRAM bitcell of claim 7, wherein said bitcell is a 10-transistor bitcell in which each Schmitt trigger inverter consists of said PMOS transistor, said two series-connected NMOS transistors, and said NMOS feedback transistor, and in which each access transistor is a single NMOS transistor.

* * * * *